United States Patent [19]
Frankel

[11] Patent Number: 5,991,036
[45] Date of Patent: Nov. 23, 1999

[54] TWO-DIMENSIONAL OPTO-ELECTRONIC IMAGER FOR MILLIMETER AND MICROWAVE ELECTRO-MAGNETIC RADIATION

[75] Inventor: Michael Y. Frankel, Crofton, Md.

[73] Assignee: The United States of America as represented by the Secretary of the Navy, Washington, D.C.

[21] Appl. No.: 08/940,177

[22] Filed: Sep. 30, 1997

[51] Int. Cl.$^6$ .............................. G01J 4/00; G01R 33/02
[52] U.S. Cl. .................. 356/364; 356/351; 324/244.1
[58] Field of Search .................. 356/364–369, 356/345, 349, 351, 352; 250/225; 359/246, 254, 255; 324/96, 244.1, 260

[56] References Cited

U.S. PATENT DOCUMENTS

| | | | |
|---|---|---|---|
| 3,950,103 | 4/1976 | Schmidt-Weinmar | 356/106 R |
| 4,533,829 | 8/1985 | Miceli et al. | 356/352 |
| 5,166,598 | 11/1992 | Gallegos et al. | 324/77 |
| 5,227,715 | 7/1993 | Ito et al. | 356/364 |
| 5,278,499 | 1/1994 | Ito et al. | 356/351 |

OTHER PUBLICATIONS

Imaizumi et al., Electric Field Distribution Measurement of Microstrip Antennas and arrays using electro–optic, Sampling, IEEE Trans. Micro. Theory and Tech., vol. 43, No. 9, pp. 2402–2407, Sep. 95.

Rahnat–Samii et al., The UCLA Bi–Polar Planar––Near–Field Antenna–Measurement and Diagnostics Range, IEEE Ant. and Prop, Mag, vol. 43, pp. 16–35, Dec. 95.

Wu et al., Dynamic Range of an Electro–Optic Field Sensor and its imaging applications, Appl. Phys. Lett. vol. 68, No. 23, pp. 3224–3226, Jun. 96.

Pfiefer et al., Electro–Optic Measurement of the Electric Neal–Field Distribution of 7 GHZ Planac Resonator, Elec. Lett., vol. 32, No. 14, pp. 1305–1307, Jul. 96.

*Primary Examiner*—Hoa Q. Pham
*Attorney, Agent, or Firm*—Barry A. Edelberg; Charles J. Stockstill

[57] ABSTRACT

A two-dimensional imager for measuring the electric-field amplitude and phase distribution across an extended spatial region for millimeter and microwave electro-magnetic waves. The imager consists of a small active area within a generally passive structure which measures the electric (E)-field amplitude and phase information and impresses this information onto an optical beam. The E-field information is measured by converting the optical signal into and electrical signal and demodulating the E-field information from the electrical signal by processing electronics where the electrical signal is conditioned, stored and the data displayed.

12 Claims, 3 Drawing Sheets

TWO-DIMENSIONAL OPTO-ELECTRONIC IMAGER FOR MILLIMETER AND MICROWAVE ELECTRO-MAGNETIC RADIATION

BACKGROUND OF THE INVENTION

1. Field of the Invention

This invention pertains generally to the precision measurement of electromagnetic fields and more specifically to a two-dimensional imager for measuring the electric-field amplitude and phase distribution across an extended spatial region.

2. Description of the Related Art

Radiating antenna apertures require a precise measurement of electro-magnetic fields which are coupled into free space. Precise knowledge of the electromagnetic field distribution in either near or far-field is required for a complete system performance characterization. The measurement provide information on the main beam shape and pointing angle, on sidelobe levels and null depths, on the presence of the deleterious grating lobes, and on element mutual coupling effects.

In the prior art, electronic near-field measurements utilize a field probe mechanically scanned above the radiating aperture. See, Rahmat-Samii et al., *The UCLA Bi-polar Planar-Near-Field Antenna-Measurement and Diagnostics Range,* IEEE Ant. and Prop. Mag., Vol. 37, No. 6, pp. 16–35, Dec. 1995. The constraints of such a system are imposed by the mechanical movement requirements such as: shielding of the support structure to minimize invasiveness and multiple reflections, mechanical probe position errors that may significantly corrupt the calculated far-field patterns, and phase errors due to the flexing microwave signal cables. Furthermore, such near-field measurement systems require precise probe calibration, are only suitable for a laboratory environment, and may not be usable on high-power systems.

Electronic far-field radar range measurements have many of the same limitations as the near-field measurements. The mechanical positioning and probe calibration errors are mitigated since the measurement is done in the far-field. However, this comes at the expense of significant real-estate demands to satisfy the far-field requirement. Additional errors are introduced by the large separation of the transmitter and the receiver measurement points requiring long distance transmission of high-frequency reference signals. The technique is only suitable for a laboratory environment and is not usable on high-power systems.

Compact range measurements suffer from requirements of the mechanical antenna scans, cannot be used for high-power systems, and require large specialized anechoic chambers.

Optical near-field measurements with probes require precise mechanical movement to mitigate positioning errors, require frequent electric (E)-field calibration, shielding of the surrounding system, and are suitable only for laboratory environments. See, Imaizumi et al., *Electric Field Distribution Measurement of Microstrip Antennas and Arrays Using Electro-Optic Sampling,* IEEE Trans. on Micro. and Techns., Vol. 43, No. 9, pp. 2402–2407, Sep. 1995.

SUMMARY OF THE INVENTION

The object of this invention is to provide a two-dimensional electric (E)-field imager apparatus capable of making minimally-invasive E-field measurements having high sensitivity, large dynamic range and wide bandwidth without mechanical constraints.

Another objective of this invention is to provide a two-dimensional E-field imager apparatus with long-term stability, and E-field polarization diversity.

These and other objectives are accomplished by a two-dimensional imager for measuring the electric (E)-field amplitude and phase distribution across an extended spatial region for millimeter and microwave electromagnetic waves. The invention uses the basic principle of linear electro-optic effect in a certain class of optical crystals whereby an electric field applied across the crystal shifts the phase of the optical beam propagating through the crystal. The imager consists of a small active area, within a generally passive structure, which measures the E-field amplitude and phase information and impresses this information onto an optical beam. The E-field information is measured by converting the optical signal into an electrical signal and demodulating the E-field information from the electrical signal by processing electronics where the electrical signal is conditioned, stored and the data displayed.

DESCRIPTION OF THE PREFERRED EMBODIMENT

This invention uses principles of integrated optics to provide a compact, robust and flexible method to implement a two-dimensional electric (E)-field imager with such beneficial properties as high sensitivity, high dynamic range, long-term stability, minimal invasiveness, high bandwidth, and E-field polarization diversity.

Figure 1:
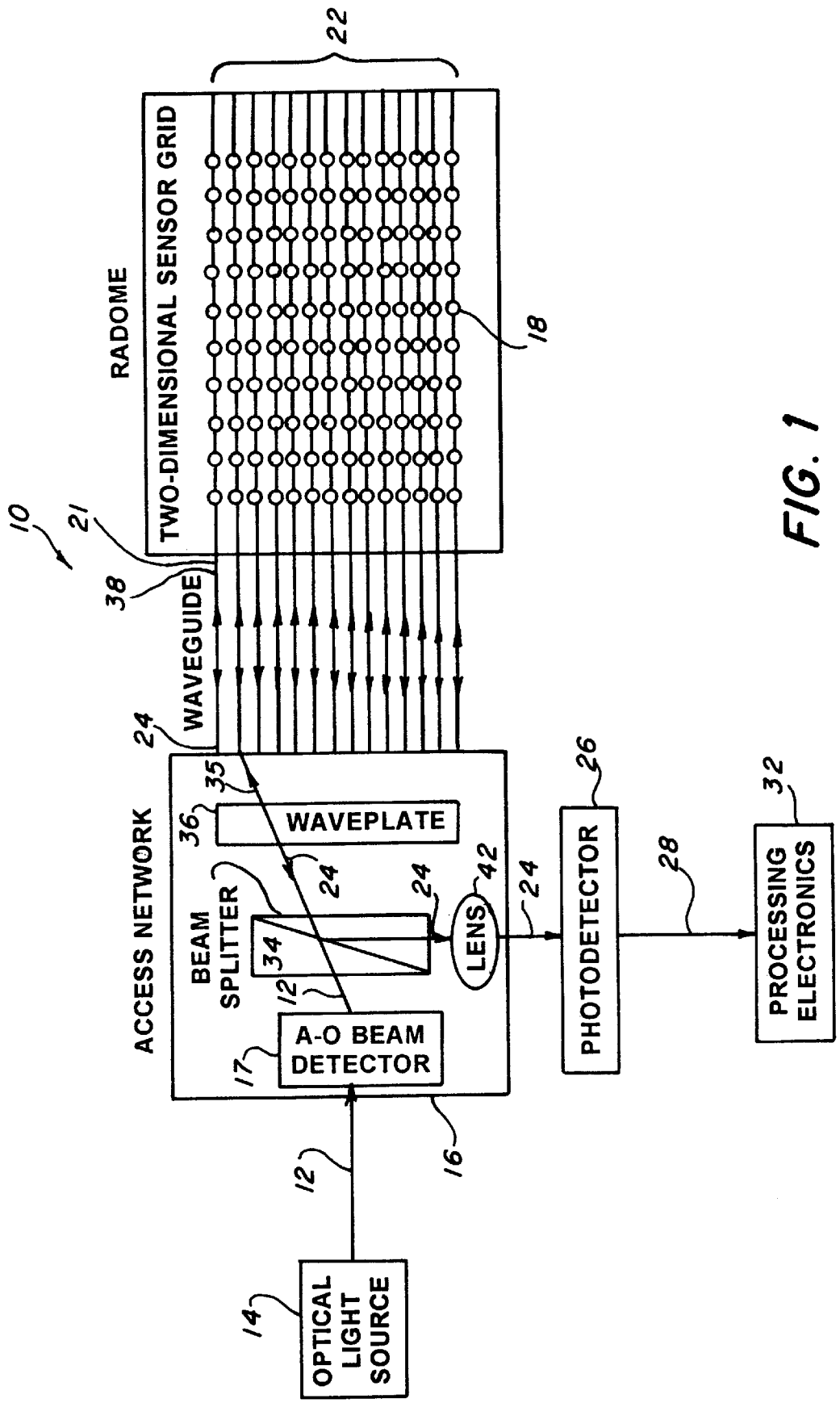
FIG. 1 shows the two-dimensional opto-electronic imager system.

The two-dimensional imager 10 for measuring the electric-field amplitude and phase distribution across an extended spatial region for millimeter and microwave electromagnetic waves, as shown in FIG. 1, uses the basic principle of linear electro-optic effect on an optical crystal whereby an electric field applied across the crystal shifts the phase of an optical beam propagating through the crystal.

In the two-dimensional imager 10, an incident optical beam 12 from an optical light source 14 is input into an access network 16. The access network 16 serves to distribute and switch the incident optical beam 12 to a specific optical waveguide 44, or path, used to access a single electric (E)-field sensor 18 on a two-dimensional sensor plane, or grid, 22 located at the end of the optical waveguide 38. The E-field amplitude and phase information is impressed onto a circularly polarized optical beam 35 by a resident electromagnetic field.

The maximum allowed E-field is determined by the nonlinearity in the sensor 18. This nonlinearity is attributed to the sine-shaped response transfer curve, and the E-field at which 1-db compression occurs defines the maximum allowed input as:

$$E_{max} = \frac{\lambda}{2\pi n^3 rd} \tag{1}$$

The bandwidth of the sensor 18 is not limited by the material response, but rather by the interaction time between the E-field and the circularly-polarized optical beam 35. The equivalent bandwidth is $$F_{3db} = \frac{0.6c}{nd} \quad (2)$$

where c is the speed of light in a vacuum. After interacting with the electro-optic material comprising the E-field sensor 18, the optical beam 35 is retro-reflected back across the access network 16, where a beamsplitter 34 separates the reflected beam 24 from the incident optical beam 12 and direct it to a photodetector 26 which converts the reflected optical signal 24 to an electrical signal 28. The phase of the reflected optical signal 24 has shifted in a pseudo-random manner by virtue of the time its takes the incident optical light beam 12 and 35 to propagate to the sensor 18 and the reflected optical beam 24 to return. The actual change in phase shift is irrelevant.

The phase shift resident in the reflected optical beam 24 is due to the electric field, E, applied to the sensor 18 which is given by the fomula:

$$\Gamma_m = \frac{2\pi}{\lambda} n^3 rEd, \quad (3)$$

where λ is the optical beam wavelength, n is the optical refractive index of the optical fiber, r is the effective electro-optic coefficient of the optical fiber, and d is the interaction length between E-field and the optical beam.

The preferred embodiment of the two-dimensional imager 10 utilizes, preferably, a single-mode, narrow-linewidth, linearly-polarized laser, a type well known to those skilled in the art, as the optical light source 14. This source provides the necessary stability and low noise for high-dynamic range measurements. The continuous-wave nature of the optical light source 14 allows for real-time measurements. The optical light source 14 may also be a mode-locked, pulsed source for equivalent-time sampling detection.

The access network 16 consists of an acousto-optic beam deflector 17, a type well known to those skilled in the art, to controllably steer the incident optical beam 12 into an appropriate input port 21 of the two-dimensional sensor plane 22; a polarizing beam splitter 34, of any type well known to those skilled in the art, with its transmission axis aligned to pass the linearly-polarized incident light beam 12 through a waveplate 36 of such order as to produce a circularly-polarized optical beam 35 when the linearly-polarized incident light beam 12 passes the waveplate 36; the two-dimensional sensor plane 22; and the same waveplate 36 on the return pass. A portion of the retro-reflected beam 24 is picked off by the polarizing beam splitter 34, with the optical phase shift introduced by the E-field sensor 18 being converted into optical amplitude modulation. This portion of the reflected beam 24 passed through an optical lens 42 that directs the reflected beam into the photodetector 26 which converts the optical amplitude modulated reflected beam 24 into an electrical signal 28 which is applied to the processing electronics 32, such as a computer, which outputs such information as a measurement of electric-field amplitude and phase distribution across an extended spatial region.

The access network 16 may have various configurations that include thermal or electro-optical switches for beam steering, different optical beam distribution methods, and different demodulation schemes. The beam splitter 34 may be a conventional type beam splitter or it may be integrated onto a wafer with the rest of the system. The access network 16 is depicted in the preferred embodiment utilizing an acousto-optic beam deflector 17 as a switch. The deflection of the optical light beam is controlled by a radio frequency (RF) signal, shifting angle as the frequency of the RF signal is changed resulting in a direct mapping from frequency to angle. However, many different types of switching systems may be utilized. For example, an electro-optical deflector may be utilized where the mapping of the output data would be accomplished by plotting a voltage to an angle. A liquid crystal hologram or mechanical manipulation of the beam may also be utilized.

The acousto-optic deflector 17 angular resolution and maximum deflection angle define the largest number of resolvable "spots", the number of resolvable "spots" defines the number on individually-addressable optical waveguides 18 appearing in the two-dimensional sensor plane 22. The largest number of resolvable "spots", N, is given by:

$$N = \frac{n\Lambda\pi\omega_o}{\lambda L} \quad (4)$$

where n is the acousto-optic material refractive index, Λ is the acoustic wavelength, $\omega_0$ is the optical beam diameter, λ is the optical wavelength, and L is the acoustic wave width. With typical material parameters, the number of resolvable spots can exceed 1000.

The waveplate 36 may be a type well known to those skilled in the art, alternatively it may be a plate of birefrigent material or a crystal plate polished to a specified thickness where the crystal direction is oriented in a specific manner.

The light collection lens 42 collects the light from the reflected optical beam 24 coming from many possible directions and focuses it on a single point in the photodetector 26. As an alternative, the lens 42 could be eliminated and a plurality of photodetectors 26 could be utilized.

The photodetector 26 is of a sufficient bandwidth to cover the bandwidth of the E-fields being measured for demodulating the E-field information from the optical carrier. Assuming the photodetector 26 has a frequency-independent responsivity, the photocurrent is composed of a direct-current (dc) component and an E-field related component as:

$$I_{photo} = I_{dc} + I_{dc}\sin(\Gamma_m) \quad (5)$$

To establish the lower limit of the sensitivity, an assume that $\Gamma_m \ll 1$. Then, the photocurrent is given as:

$$I_{photo} = I_{dc} + I_{dc}\Gamma_m = I_{dc} + I_{dc}\frac{2\pi}{\lambda}n^3 rEd \quad (6)$$

The system noise level is set by the photodetector 26 shot noise with the RMS noise photocurrent given as:

$$I_N = \sqrt{2qBI_{dc}} \quad (7)$$

where q is the electron charge, and B is the detection electronics bandwidth. (Note: this is not the electro-optic sensor bandwidth.) Thus, if the modulated and the noise photocurrents are equated, the minimum detectable E-field is $$E_{min} = \sqrt{\frac{2qB}{I_{dc}} \cdot \frac{\lambda}{2\pi n^3 rd}} \quad (8)$$

The electrical signal 18 is applied to processing electronics 32 for conditioning the signal, storing and displaying data.

The preferred embodiment of the two-dimensional optoelectronic imager system 10 depicts a single waveguide 38 interfacing with a plurality of sensors 18. The optical source 14 would be a tunable laser 14 and the sensors 18 would contain a selective mirror (not shown) that would only collect a single wavelength. So, as the wavelength of the optical light source 14 is changed, the optical light would couple with different sensors 18, depending upon the wavelength the mirror reflects.

In a second configuration of the two-dimensional sensor plane, or grid, 22 wherein an individual waveguide 38 interfaces with an individual sensor 18, the optical light source 14 would be a single frequency laser. But in both configurations the laser output from the optical light source 14 would be a continuous-wave (CW) laser. The configuration selected by the designer would be an individual preference as to the preferred design of the two-dimensional sensor grid 22.

Figure 2:
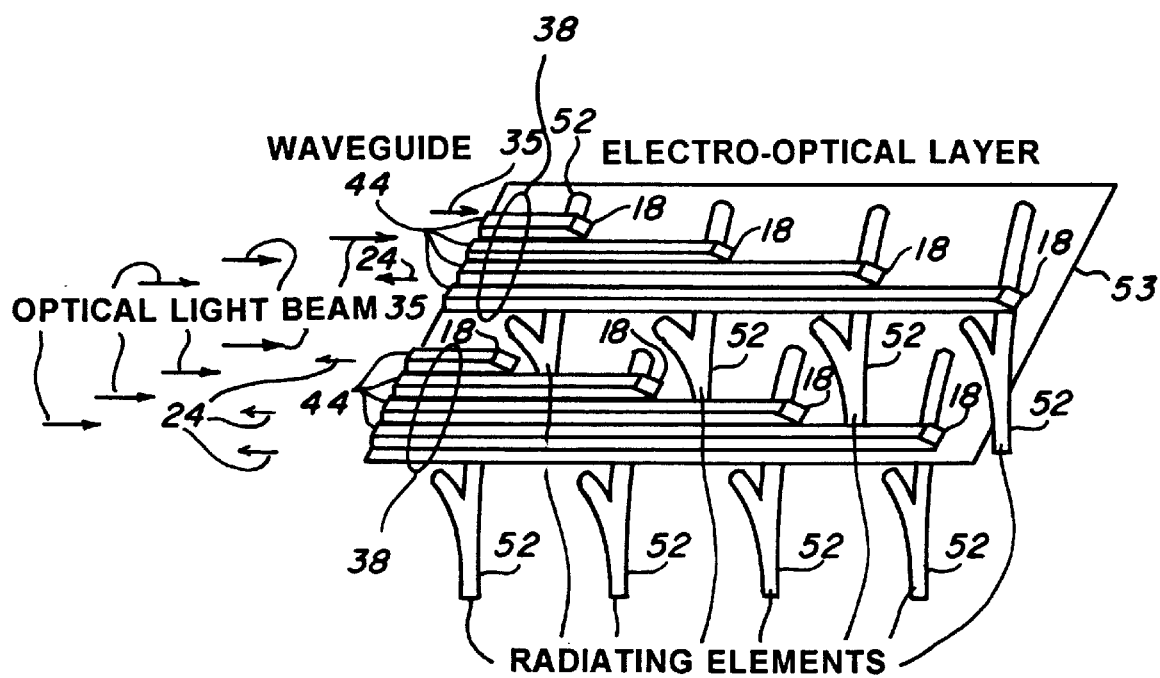
FIG. 2 shows the sensing grid of the two-dimensional opto-electronic imager system.

The second configuration of the two-dimensional sensor plane 22 is shown in FIG. 2. The ends of one optical waveguide bundle 38 containing a plurality of optical fibers, or waveguides, 44 is terminated with an individual sensor element 18 on a thin substrate 53 providing mechanical support. A number of optical waveguides 44 are integrated on a substrate 53 to confine and guide the optical light beams 35 and 24 to and from the individual sensor elements 18. The density of the waveguides 44 equates to 50 waveguides 44 occupying a space of 2 mm with a spacing between them of approximately 40 micrometers. The sensor elements 18 are based on the electro-optic materials previously described. Also, various waveguide 44, substrate 53 and sensor 18 orientations are possible. Further, wavelength-division multiplexing techniques may be employed to reduce the required number of wave guides 44. The preferred embodiment uses sensors 18 incorporating an integrated mirror (not shown) to retro-reflect the circularly polarized incident optical beam 35 through the same optical waveguide 44, comprised of a bundle of optical fibers. For example, the waveguides 44 may be arranged on a 40 $\mu$m pitch, with a corresponding packing density of ~50 waveguides in 2 mm. For high-frequency arrays with small elements, a large number of column sampling points per row can be defined. The waveguides 44 are single-mode and fabricated on the planar surface of the substrate 53 through etching or selective deposition. Typically, the two-dimensional imaging layer is comprised of the waveguides 44, manufactured by PIRI, Inc. of Columbus, Ohio. The sensors 18 may be made of a large class of electro-optic materials, of which a preferable material $LiNbO_3$ is a member. Such materials must be selectively sensitive to specific polarizations of the E-field and may be used to form the E-field sensor 18. Measurements of E-field polarizations is accomplished by interlaying two-dimensional networks of sensors 18 with their E-field sensitive directions being orthogonal to each other.

An example may be shown by assuming a $LiNbO_3$-based sensor (n~2.2, r~20 pm/V) with a length of 1 mm being probed by $\lambda$=1.33 $\mu$m light. A typical high-speed photodetector can handle at most a photocurrent of $I_{dc}$~1 mA. A measurement processing system may have a bandwidth of B=100 Hz to allow for a 10 ms measurement time per sensor. Then $E_{min}$~0.2 V/m $E_{max}$~1·10$^6$ V/m dynamic range~130 db $f_{3\ db}$~80 GHz.

Figure 3:
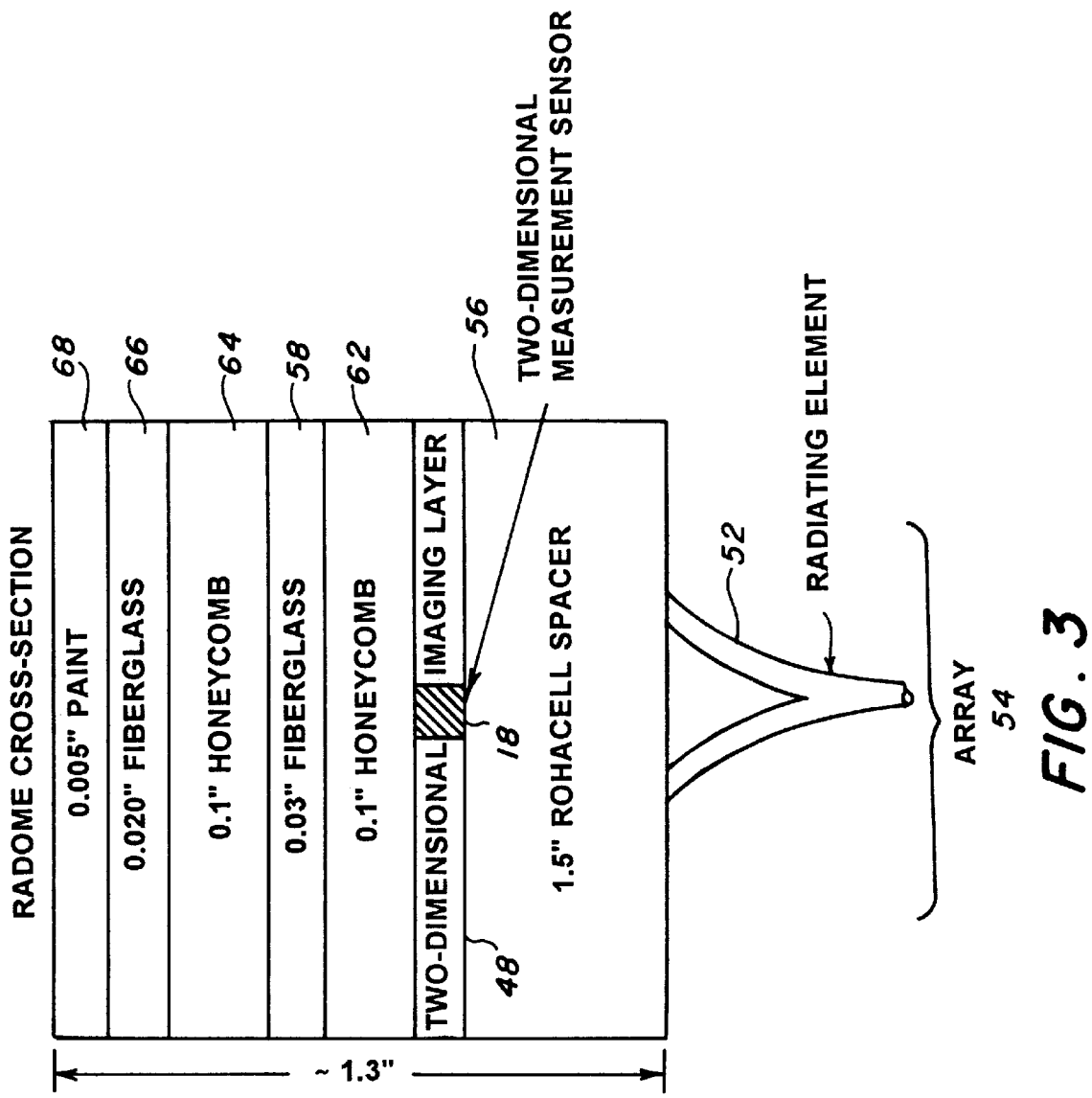
FIG. 3 shows a cross-section of a typical installation of the two-dimensional imaging layer and sensor in a radome.

The preferred embodiment of this invention has a potential application as a near-field measurement system for phased array antennas. It is anticipated that the imager is incorporated into a standard radome approximately 1.8 inch thick, or similar cover, as shown in FIG. 3. A two-dimensional grid 22 of electro-optical sensors 18, similar to that shown in FIG. 2, is located above a radiating element 52 of an array 54 separated by an approximately one and one-half inch thick spacer layer of Rohacell® 56, or a similar foam-like material that is electrically transparent. Subsequently, a layer of 0.03 inch fiberglass material 58 between layers of 0.1 inch honeycomb material 62 and 64. The outer layer of honeycomb material 64 is capped with a 0.002 inch fiberglass layer 66 which coated with a 0.005 inch layer of paint 68. The imaging layer 48 is transparent to the electromagnetic emissions from the radiating element 52 and does not attenuate or distort the transmitted signals.

The processing electronics 32 receives the electrical signal 28 from the photodetector 26 that is a replica of the reflected optical signal 24 gathered by the sensors 18. If the measurement of an electrical signal power at any point were desired, then only the power is processed within the processing electronics 32. If both amplitude and phase are desired, more sophisticated processing would be required. The method of processing the information desired within the processing electronics 34 is well known to those skilled in the art.

Therefore, this invention is capable of providing a two-dimensional E-field imager apparatus capable of making minimally-invasive E-field measurements with polarization diversity having high sensitivity, large dynamic range and wide bandwidth without mechanical constraints. Further, it has a long-term stability, and E-field polarization diversity.

This invention not only has applications in electronic warfare and radar systems, where accurate characterization of the operation of phased-array antennas is critical. Complete diagionistic information is provided on the individual radiating module operation in a phased array, on the total array patterns, and on any malfunctions in the array operation. Such information may be used to determine the single element patterns, and the inter-element coupling in a phased array antenna in a phased array antenna. The system will permit in-field antenna repair and recalibration, dynamic self-healing, and dynamic far-field radiation pattern synthesis based on accurate near-field measurements.

The invention also has a broad range of other applications. For example, it may be used as the receiver for an electro-optic imaging system through opaque objects such as security screening of baggage or personnel. The are also medical applications either as part of the electromagnetic imaging system (similar to X-ray or optical tomography) or as a detector in a film-less X-ray system when used with a front-end X-ray to electric-field converter.

Although the invention has been described in relation to an exemplary embodiment thereof, it will be understood by those skilled in the art that still other variations and modifications can be affected in the preferred embodiment without detracting from the scope and spirit of the invention as described in the claims.

What is claimed is:

1. A two-dimensional imager for measuring parameters of an electromagnetic field across an extended spatial region comprised of:

means for converting a linearly polarized optical light beam into a circularly polarized optical light beam;

an electric-field sensor on a two-dimensional sensor plane for receiving signals generated by the electromagnetic field and generating a retro-reflected optical light beam;

means for distributing the circularly polarized optical light beam to the electric-field sensor;

means for converting the received reflected optical light beam into an electrical signal; and means for storing, calculating and displaying parameters of the electromagnetic field across the expanded spatial region from data contained in the electrical signal.

2. An imager, as in claim 1, wherein the electric-field sensor is made of a layer of an electro-optic material.

3. An imager, as in claim 1, wherein the means for converting said linearly polarized light beam into a circularly polarized optical light beam is a wave plate.

4. An imager, as in claim 1, wherein the means for distributing the circularly polarized optical light beam is an acousto-optic beam deflector.

5. An imager, as in claim 1, wherein the means for receiving said retro-reflected optical light beam and converting it to an electrical signal is a photodetector.

6. An imager, as in claim 1, wherein the means for calculating the parameters of the electromagnetic field across the expanded spatial region from data contained in the electrical signal; and the means for displaying the parameters of the electromagnetic field is a computer.

7. An imager, as in claim 1, wherein the parameters of the electromagnetic field are electrical signal power, electric-field amplitude and phase distribution.

8. A two-dimensional imager for measuring parameters of an electromagnetic field across an extended spatial region comprised of:

a laser source generating a linearly-polarized optical light beam;

means for converting the linearly polarized optical light beam into a circularly polarized optical light beam;

a plurality of two-dimensional electro-optical sensors within an electromagnetic field;

means for distributing the circularly polarized optical light beam to the plurality of two-dimensional electro-optical;

said sensors producing a reflected optical light having an optical phase shift resulting from the interaction of the electromagnetic field and said circularly polarized optical light beam, said optical phase shift determining the parameters for calculating electrical signal power, electric-field amplitude and phase distribution across the expanded spatial region;

a polarizing beam splitter with its transmission axis aligned to pass the linearly-polarized optical light beam, for receiving the reflected optical light beam from the sensors with an optical phase shift, converting the reflected optical light beam into an amplitude modulated optical light beam, and redirecting the amplitude modulated optical light beam;

means for converting a redirected amplitude modulated optical light beam into an electrical signal; and a computer for storing, calculating, and displaying the electrical signal power, electric-field amplitude and phase distribution across the expanded spatial region from data contained in the electrical signal.

9. A two-dimensional imager for measuring parameters of an electromagnetic field across an extended spatial region comprised of:

a laser source for generating an linearly-polarized optical light beam;

an output polarization beam splitter;

a wave plate of such order to receive said linearly polarized light beam and produce a circularly-polarized light output, said circularly-polarized light beam being applied to the output polarization beamsplitter;

a plurality of two-dimensional electro-optical sensors placed within the electromagnetic field that reflect a phase shifted optical light beam generated when the electromagnetic field and circularly-polarized light beam interact;

an acousto-optic beam deflector to controllably steer the linearly polarized optical light beam through a beam splitter and wave plate to each of the plurality of sensors;

said polarizing beam splitter having its transmission axis aligned so as to pass the linearly polarized optical light, receive a reflected optical light beam, and convert the reflected optical light beam into an optical amplitude modulated optical light beam;

a photodetector for converting the optical amplitude modulated optical light beam into an electrical signal; and a computer for storing, calculating and displaying the electric field power, electric-field amplitude and phase distribution across the expanded spatial region from data contained in the electrical signal.

10. A method for measuring parameters of an electromagnetic field across an expanded spatial region comprised of the steps of:

generating a linearly polarized optical light beam;

converting the linearly polarized optical light beam into a circularly polarized optical light beam;

distributing the circularly polarized optical light beam to a two-dimensional sensor plane located within the electromagnetic field where a phase shifted reflected optical light beam is generated upon interaction of the circularly polarized optical light beam and electromagnetic field;

converting the received reflected optical light beam into an electrical signal; and storing, calculating and displaying electric-field amplitude and phase distribution across the expanded spatial region from data contained in the electrical signal.

11. A two-dimensional imager for measuring parameters of an electromagnetic field across an extended spatial region comprised of:

a plurality of electric-field sensors forming a two-dimensional sensor plane matrix for receiving signals generated by the electromagnetic field and generating a retro-reflected optical light beam;

said sensors matrix being integrated into a radome structure; and said radome structure having mechanical support and anti-reflection layers.

12. A two-dimensional imager for measuring parameters of an electromagnetic field across an extended spatial region comprised of:

means for generating an optical light beam having a plurality of wavelengths;

a plurality of electric-field sensors, each sensor being responsive to a linearly polarized optical light of a different wavelength;

means for wavelength multiplexing the linearly polarized optical light beam so as to address an individual sensor responsive to a particular wavelength of the optical light beam;

means for converting the linearly polarized optical light beam into a circularly polarized optical light beam;

said electric-field sensor placed in a two-dimensional sensor plane receiving a signal generated by the electromagnetic field and generating a retro-reflected optical light beam;

means for converting the received reflected optical light beam into an electrical signal; and means for storing, calculating and displaying parameters of the electromagnetic field across the expanded spatial region from data contained in the electrical signal.

* * * * *